United States Patent
Boubal et al.

(10) Patent No.: US 7,053,356 B2
(45) Date of Patent: May 30, 2006

(54) PHOTODETECTION CELL AND LASER PULSE DETECTOR HAVING A CASCODED INVERTING AMPLIFIER LOOPED BACK THROUGH A SLOW FOLLOWER TYPE FEEDBACK

(75) Inventors: Michel Boubal, Bourges (FR); Olivier Gevin, Paris (FR)

(73) Assignee: MBDA France, Paris (FR)

( * ) Notice: Subject to any disclaimer, the term of this patent is extended or adjusted under 35 U.S.C. 154(b) by 408 days.

(21) Appl. No.: 10/424,103

(22) Filed: Apr. 28, 2003

(65) Prior Publication Data

US 2003/0205663 A1 Nov. 6, 2003

(30) Foreign Application Priority Data

May 6, 2002 (FR) .................................. 02 05622

(51) Int. Cl.
*H01J 40/14* (2006.01)
(52) U.S. Cl. .............................. 250/214 R; 250/214.1; 250/214 A; 257/127
(58) Field of Classification Search ............ 250/214 A, 250/214 R, 214.1; 257/127, 170
See application file for complete search history.

(56) References Cited

U.S. PATENT DOCUMENTS 5,376,813 A 12/1994 Delbruck et al.
6,023,058 A * 2/2000 Merle et al. ............. 250/208.2
6,469,489 B1 * 10/2002 Bourquin et al. ............. 324/96
2002/0024058 A1 2/2002 Marshall et al.

FOREIGN PATENT DOCUMENTS

EP 1065809 1/2001
FR 2753796 3/1998

OTHER PUBLICATIONS

Search Report dated Jan. 31, 2003.
Orly Yadid-Pecht, "Wide-Dynamic-Range Sensors", Optical Engineering, Soc. of Photo-Optical Instrumentation Engineers, Bellingham, vol. 38, No. 10, pp. 1650-1660, Oct. 1999.

* cited by examiner

*Primary Examiner*—Stephone B. Allen
(74) *Attorney, Agent, or Firm*—Stevens, Davis, Miller & Mosher, LLP

(57) ABSTRACT

Photodetection cell and laser pulse detector furnished with such a cell, as well as laser pulse detection device comprising a matrix of such detectors.

The photodetection cell (1) is embodied in the form of an integrated circuit and comprises a photosensor (3) which is able to transform luminous energy received into an electric current and a means (4) for processing the electric current generated by said photosensor (3). Said processing means (4) comprises a cascoded inverting amplifier (5), looped back through a feedback (6) of slow follower type, which is supplied by the electric current generated by said photosensor (3).

7 Claims, 3 Drawing Sheets

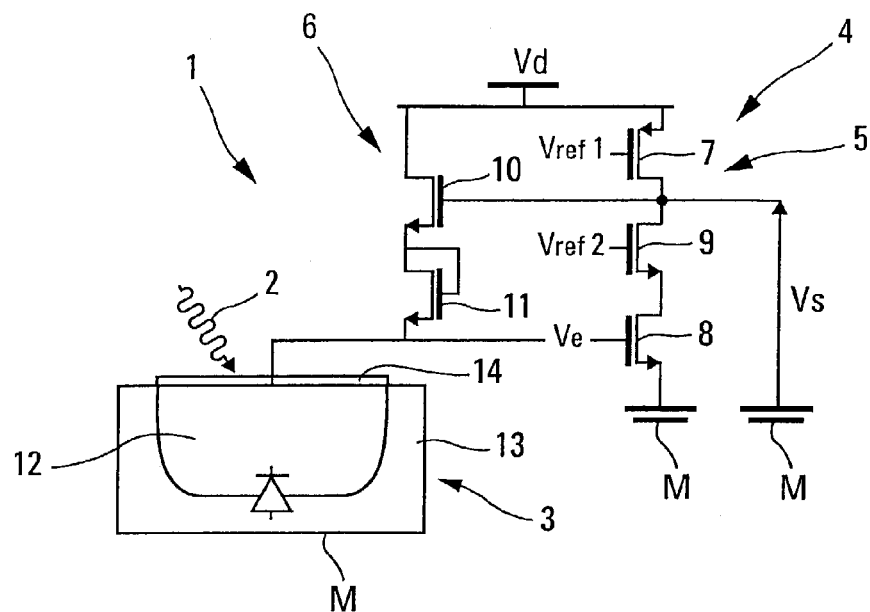
Fig. 1
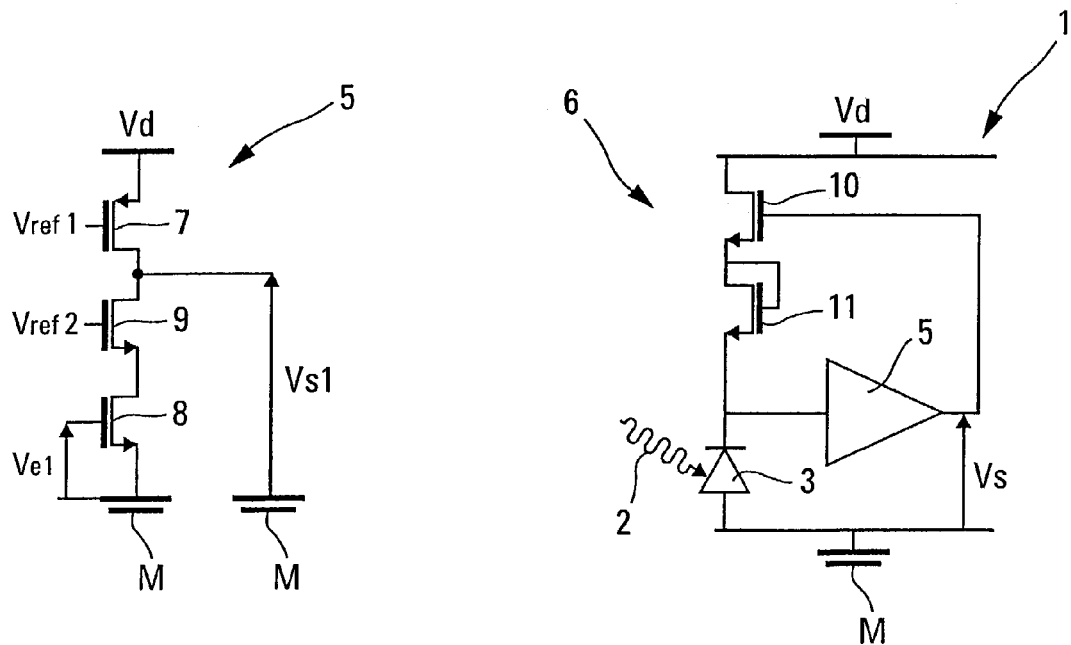
Fig. 2
Fig. 3

PHOTODETECTION CELL AND LASER PULSE DETECTOR HAVING A CASCODED INVERTING AMPLIFIER LOOPED BACK THROUGH A SLOW FOLLOWER TYPE FEEDBACK

FIELD OF THE INVENTION

The present invention relates to a photodetection cell and a laser pulse detector furnished with a photodetection cell, as well as a laser pulse detection device comprising a matrix of detectors of this type.

BACKGROUND OF THE RELATED ART

Although not exclusively, said detection device is intended more particularly to detect a laser pulse of very short duration (for example 20 ns) which is emitted in an ambient luminous environment of variable illumination, at a predetermined frequency (for example 10 Hz). By way of illustration, the laser pulse to be detected may be emitted by a laser source which is pointed at a target, for example a tank, in order to designate it so that it can be located by a weapon system, such as a missile, which is equipped with said detection device and which is intended to destroy this target. For this purpose, said laser pulse detection device is for example associated with the homing head of the missile, is disposed fixedly on said missile and observes the space forward of said missile. The information relating to the locating of the target and which is generated by this detection device, is provided to the homing head which uses it to guide the missile onto the target.

A considerable drawback relating to the use of such a detection device resides in the presence, in addition to the low-energy and short-duration laser pulses that one wishes to detect, of numerous illuminations, in particular solar, which form luminous background noise, often making it very difficult to detect said sought-after laser pulses.

Patent FR-2 753 796 discloses a photosensitive detector for the detection of luminous flashes, this photosensitive detector comprising:
- a photosensitive diode capable of transforming the luminous energy received into an electric current or electrical signal; and
- a means of processing the electrical signals generated by said photosensitive diode, said processing means comprising a differentiator electrical circuit which:
  - on the one hand, strengthens the electrical signals exhibiting a fast rise time and corresponding to a sought-after luminous flash received by the photosensitive diode; and
  - on the other hand, attenuates the electrical signals corresponding to illuminations which vary more slowly in intensity, of said photosensitive diode.

This photosensitive detector therefore makes it possible to demarcate a luminous flash with respect to the luminous background noise.

However, when one wishes to make a photosensitive detector of this type, for an application such as the aforesaid, several constraints are encountered, and in particular:
- a size constraint. The detector should in fact exhibit a much reduced size, for example 70 µm×70 µm;
- a cost constraint. To be economical, the detector should exhibit a very low fabrication cost; and
- a technical constraint. The detector should be able to detect and extract from the luminous background a laser pulse of short duration (for example 20 ns) and of very low energy (for example $10^{-13}$ J).

SUMMARY OF THE INVENTION

The object of the present invention is to remedy these drawbacks. It relates to a photodetection cell, of reduced cost, allowing particularly efficient detection of a laser pulse of very short duration and of low energy which is emitted, in an ambient luminous environment, of variable illumination.

For this purpose, according to the invention, said photodetection cell embodied in the form of a CMOS technology integrated circuit and comprising a photosensor which is able to transform luminous energy received into an electric current and a means for processing the electric current generated by said photosensor, is noteworthy in that said processing means comprises a cascoded inverting amplifier, looped back through a feedback of slow follower type, which is supplied by the electric current generated by said photosensor.

Thus, one obtains a photodetection cell which is particularly efficient in isolating (and amplifying) the electric current relating to a light pulse of short duration, with respect to the overall electric current which is generated by said photosensor and which also comprises the luminous background, in such a way as subsequently to be able to process the signal corresponding to this luminous pulse.

Moreover, as will be seen in greater detail hereinbelow, said photodetection cell exhibits numerous additional advantages. It is in particular compact, simple to make and highly insensitive to technological scatter.

Additionally, said photoelectric cell exhibits a reduced cost, in particular by reason of its embodiment in the form of an integrated circuit through a standard CMOS fabrication process.

According to the invention, said feedback comprises a follower (of slow type) comprising several identical NMOS transistors arranged in series and supplied by the electric current generated by said photosensor. Preferably, said follower comprises two NMOS transistors.

Moreover, in a preferred embodiment, said photosensor is a well/substrate type photodiode, which is especially appropriate to the detection of an infrared laser pulse.

The present invention also comprises a laser pulse detector which comprises a photodetection cell such as that described hereinabove.

Advantageously, said detector moreover comprises:
- a high-pass filter with feedback inverting amplifier; and/or
- a comparator with PMOS differential pair with NMOS load, for comparing the response of the photodetection cell with an adjustable threshold; and/or
- a storage cell.

Additionally, the present invention also relates to a laser pulse detection device, which is noteworthy in that it comprises a plurality of laser pulse detectors, of the aforesaid type, which are formed on an integrated circuit and which are disposed in rows and columns in matrix form.

BRIEF DESCRIPTION OF THE DRAWINGS

The figures of the appended drawing will elucidate the manner in which the invention may be embodied. In these figures, identical references designate similar elements.

FIG. 1 diagrammatically represents a photodetection cell in accordance with the invention.

FIGS. 2 and 3 show, diagrammatically, respectively an amplifier and a follower of the photodetection cell of FIG. 1.

DETAILED DESCRIPTION OF THE INVENTION

Figure 4:
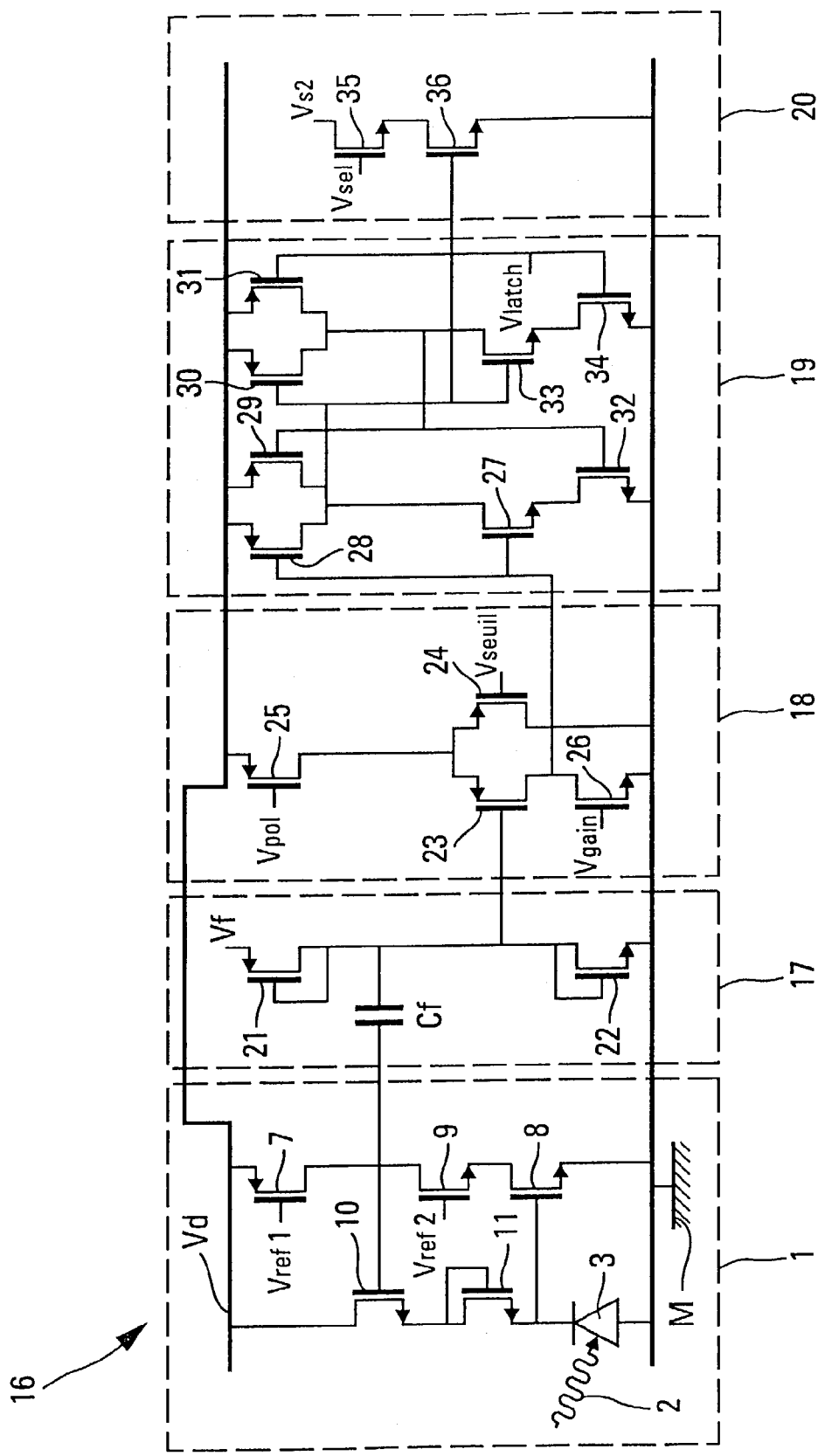
FIG. 4 diagrammatically represents a laser pulse detector in accordance with the invention.

The photodetection cell 1 in accordance with the invention and represented in FIG. 1 is intended more especially to detect a laser pulse 2 of very short duration (for example 20 ns) and of very low energy (for example $10^{-13}$ J), which is emitted in an ambient luminous environment of variable illumination, at a predetermined frequency (for example 10 Hz).

Said photodetection cell 1 which is embodied in the form of a CMOS technology integrated circuit is of the type comprising a photosensor 3, which is capable of transforming luminous energy received into an electric current and a means 4 of processing the electric current generated by said photosensor 3.

According to the invention, said processing means 4 comprises a cascoded inverting amplifier 5, looped back through a feedback 6 of slow follower type, which is supplied by the electric current generated by said photosensor 3. This processing means 4 outputs a voltage Vs, as a function of the input voltage Ve applied to it.

The cascoded inverting amplifier 5 comprises, as represented in FIG. 2, between a load transistor 7 (at the load voltage Vd, with a reference voltage Vref1) and a signal transistor 8 (receiving a voltage Ve1 as input signal) linked to the ground M of the circuit, a stage of common gate type composed of a transistor 9 of the same type as the transistor 8 [for example an NMOS transistor, that is to say an N-channel metal oxide semiconductor], whose gate is biased to a reference voltage Vref2. The output voltage from this amplifier 5 is denoted Vs1.

The feedback 6 comprises, as represented in FIG. 3, a transistor 10 to whose gate the system is fed back and at least one transistor 11, preferably identical to the transistor 10, which is arranged in series with said transistor 10. The various transistors 10, 11 are supplied by the electric current generated by the photosensor 3. This follower of slow type can comprise a plurality of NMOS transistors. In a preferred embodiment, it comprises just two transistors 10 and 11, as is represented in FIGS. 1 and 3.

It will be noted that for slow variations of the current supplying the feedback 6, the amplifier 5 is fed back whereas, for a fast variation, it operates in open loop. The photodetection cell 1 is therefore characterized by a dynamic gain and a static gain which are such that:

for the dynamic gain (response of the photodetection cell 1 to a current pulse iph generated by the photosensor 3 following its illumination by a laser pulse 2), over almost the entire range of background current on which the laser pulse 2 is superimposed, the response of the cell 1 equals, if the open-loop gain of the amplifier 5 is independent of this background current:

$$Zac = \frac{Vs}{iph} = \frac{A \cdot t}{C}$$

with:
t, the duration of the pulse 2;
A, the gain of the amplifier 5 in open loop;
C, the capacitance of the photosensor 3; and
Vs, the amplitude of the response at the output of the cell 1;
for the static gain, the changing of the current passing through the photosensor from i0 to i1 modifies the DC voltage at the output of the cell 1 from V0 to V1:

$$V1 = V0 + nVt\frac{A}{A+1} \ln \frac{i1}{i0}$$

with:
n, the number of transistors in the loop (two in the example of FIGS. 1, 3 and 4); and
Vt, the thermodynamic potential.

This corresponds to the unamplified response of a logarithmic detector to a slow current. One benefits from the large dynamic input swing which is the attraction of this photodetector, in a manner virtually independent of the gain A of the amplifier.

Additionally, in the preferred embodiment represented in FIG. 1, the photosensor 3 is a photodiode of deep well type comprising an N-type well 12 which is formed in a P-type substrate 13 which is endowed with an illumination surface 14. Such a photodetector 13 is especially appropriate to the detection of an infrared laser pulse.

It will be noted that the photodetection cell 1 in accordance with the invention is capable of detecting a 20 ns (laser) light pulse of less than 0.1 µW, this corresponding to an energy of the order of a femtojoule. Moreover, its sensitivity is almost independent of the level of the continuous luminous background, on which the light pulse 2 is superimposed, and is so over a background dynamic swing of 6 decades.

Thus, by virtue of the invention, one obtains a photodetection cell 1 which is especially effective in isolating (and amplifying) the electric current relating to a light pulse 2 of short duration, with respect to the overall electric current which is generated by said photosensor 3 and which also comprises the luminous background, in such a way as to be able to process the signal corresponding to this light pulse 2.

Furthermore said photodetection cell 1 exhibits numerous additional advantages. It is in particular compact, simple to make, highly insensitive to technological scatter, and moreover exhibits a reduced cost, in particular by virtue of its embodiment in the form of an integrated circuit in standard CMOS technology.

Said photodetection cell 1 can be integrated into a laser pulse detector 16 represented according to a preferred embodiment in FIG. 4.

Said detector 16 comprises, in addition to said photodetection cell 1, in succession:
a filtering means 17;
a comparator 18;
a storage cell 19; and
a line selection means 20.

Although its sensitivity is independent of the level of the luminous background, the photodetection cell 1 does not filter the slow component of the background. The object of the filtering means 17, which comprises a high-pass filter, is to carry out this filtering.

Said filtering means 17 is a high-pass filter with feedback inverting amplifier comprising, in addition to a capacitance Cf, two transistors 21 and 22 which constitute the amplifier and which are arranged in diode mode. The equivalent resistance is inversely proportional to the sum of their transconductance, and the stray capacitances introduced by the amplifier at the output of the cell are mainly the gate/source capacitances of the transistors 21 and 22. The transistor 21 is subjected to a bias voltage Vf.

It will be noted furthermore that the minimum value of the capacitance Cf is imposed by the size of the transistors 21 and 22 of the filtering means 17 and the maximum value depends on the area of silicon that one wishes to use: the capacitances are produced by superimposing polysilicon layers 1 and 2 for example. A capacitance of 180 fF occupies an area of the order of 100 $\mu m^2$.

Additionally, the object of the comparator 18 is to reduce the stray detections by raising the comparison threshold, when the power of the luminous energy is considerable. For this purpose, said comparator 18 is a comparator with PMOS differential pair (transistors 23 and 24) [PMOS: P-channel metal oxide semiconductor] with NMOS load (transistors 25 and 26), for comparing the signal arising from the filtering means 17 with an adjustable threshold (Vseuil).

The transistor 25 (subjected to a bias voltage Vpol) is used as current source and the transistor 26 is a voltage-controlled resistor (Vgain).

As far as the storage cell 19 is concerned, it is embodiment in the form of a standard memory of "latch" type, comprising transistors 27 to 34 and associated with a control voltage Vlatch. The object of this storage cell 19 is to store the passing of the comparator 18 through a low level corresponding to the detection of a light pulse.

Additionally, the line selection means 20 comprises two transistors 35 and 36 and is associated with a control voltage Vsel. Said means 20 therefore delivers the output signal (Vs2) of said laser pulse detector 16.

Consequently, the detector 16 comprises five bias voltages (Vref1, Vref2, Vf, Vgain, Vpol) and three control voltages (Vseuil, Vlatch, Vsel).

Figure 5:
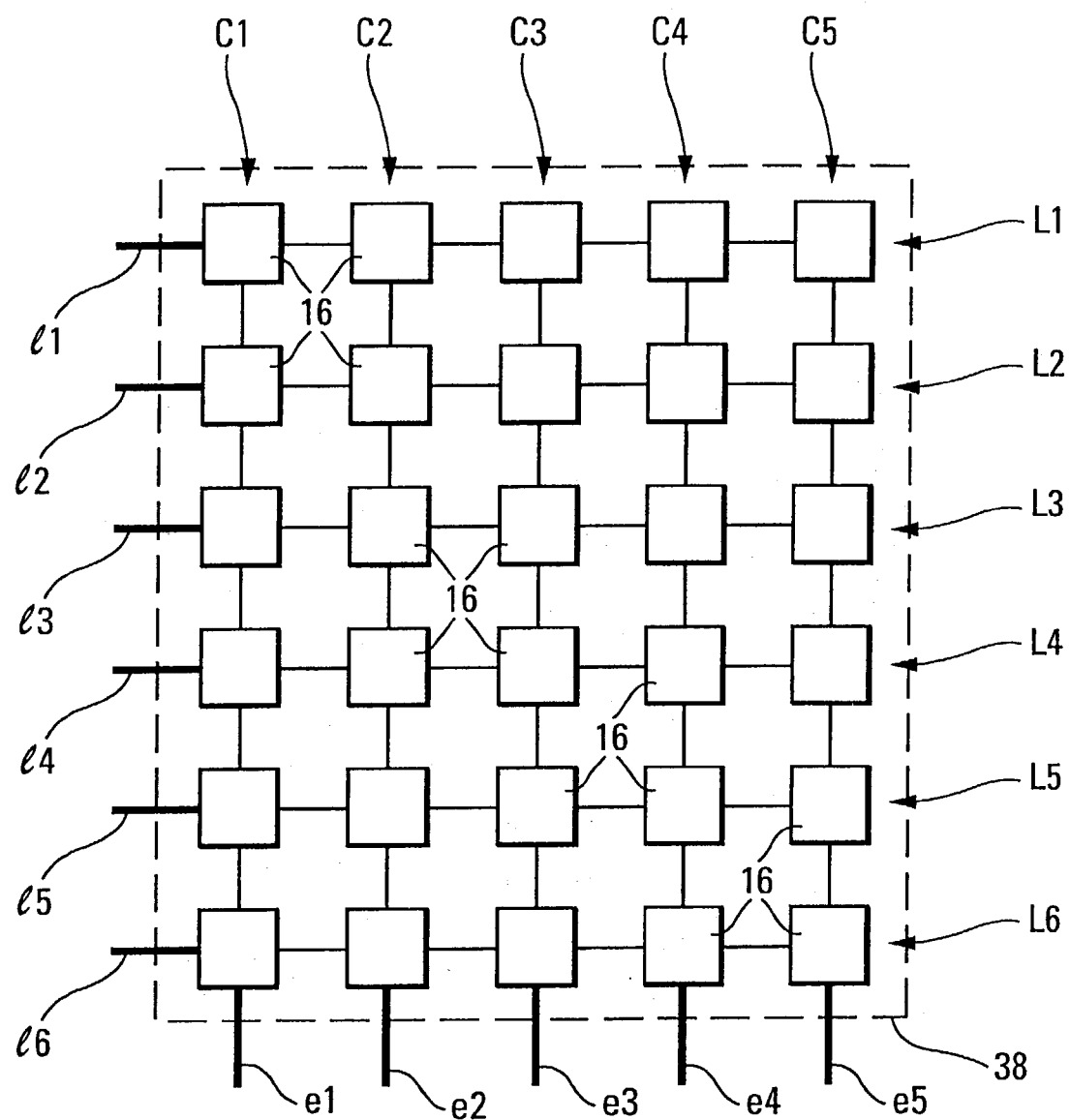
FIG. 5 shows, diagrammatically and partially, a laser pulse detection device in accordance with the invention.

Such a detector 16 can form part of a laser pulse detection device 38. For this purpose, this device 38 comprises, as represented partially in FIG. 5, a plurality of laser pulse detectors 16, such as the aforesaid, which are formed on an integrated circuit and which are disposed in rows L1, L2, L3, L4, L5, L6 (with output links l1 to l6) and in columns C1, C2, C3, C4, C5) with output links e1 to e5), in matrix form.

The invention claimed is:

1. A photodetection cell embodied in a CMOS-technology integrated circuit, the photodetection cell comprising:
   a photosensor that transforms received luminous energy into an electric current; and
   a circuit that processes the electric current generated by the photosensor, wherein:
   the circuit comprises a cascoded inverting amplifier that is looped back through a feedback section of a slow follower type,
   said feedback section includes a follower which comprises identical NMOS transistors arranged in series, and
   the follower is supplied with the electric current generated by the photosensor.

2. The photodetection cell of claim 1, wherein the follower comprises two NMOS transistors.

3. The photodetection cell of claim 1, wherein the photosensor is a well/substrate type photodiode.

4. A laser pulse detector comprising a photodetection cell embodied in a CMOS-technology integrated circuit, the detector comprising:
   a photosensor that transforms received luminous energy into an electric current;
   a processing circuit that processes the electric current generated by the photosensor to produce a signal; and
   a high-pass filter having a feedback inverting amplifier that filters the signal produced by the processing circuit, wherein:
   the processing circuit comprises a cascoded inverting amplifier that is looped back through a feedback section of a slow follower type,
   said feedback section includes a follower which comprises identical NMOS transistors arranged in series, and
   the follower is supplied with the electric current generated by the photosensor.

5. A laser pulse detector comprising a photodetection cell embodied in a CMOS-technology integrated circuit, the detector comprising:
   a photosensor that transforms received luminous energy into an electric current;
   a processing circuit that processes the electric current generated by the photosensor to produce a signal; and
   a comparator, having a PMOS differential pair and an NMOS load, that compares the signal produced by the processing circuit with an adjustable threshold, wherein:
   the processing circuit comprises a cascoded inverting amplifier that is looped back through a feedback section of a slow follower type,
   said feedback section includes a follower which comprises identical NMOS transistors arranged in series, and
   the follower is supplied with the electric current generated by the photosensor.

6. The detector of claim 5, further comprising a storage cell that stores a comparison result produced by the comparator.

7. A laser pulse detection device comprising:
   a plurality of laser pulse detectors formed on an integrated circuit and disposed in rows and columns in matrix form, each laser pulse detector comprising:
   a photosensor that transforms received luminous energy into an electric current; and
   a circuit that processes the electric current generated by the photosensor, wherein:
   the circuit comprises a cascoded inverting amplifier that is looped back through a feedback section of a slow follower type,
   said feedback section includes a follower which comprises identical NMOS transistors arranged in series, and
   the follower is supplied with the electric current generated by the photosensor.

* * * * *